(12) United States Patent
Sdrulla et al.

(10) Patent No.: US 8,841,718 B2
(45) Date of Patent: Sep. 23, 2014

(54) PSEUDO SELF ALIGNED RADHARD MOSFET AND PROCESS OF MANUFACTURE

(71) Applicant: Microsemi Corporation, Bend, OR (US)

(72) Inventors: Dumitru Sdrulla, Bend, OR (US); Marc H. Vandenberg, Bend, OR (US); Eric Karlsson, Napa, CA (US)

(73) Assignee: Microsemi Corporation, Bend, OR (US)

( * ) Notice: Subject to any disclaimer, the term of this patent is extended or adjusted under 35 U.S.C. 154(b) by 40 days.

(21) Appl. No.: 13/742,253

(22) Filed: Jan. 15, 2013

(65) Prior Publication Data

US 2013/0181280 A1    Jul. 18, 2013

Related U.S. Application Data

(60) Provisional application No. 61/586,888, filed on Jan. 16, 2012.

(51) Int. Cl.
*H01L 29/78*    (2006.01)
*H01L 29/66*    (2006.01)

(52) U.S. Cl.
CPC ...... *H01L 29/7827* (2013.01); *H01L 29/66666* (2013.01)
USPC .......................................................... 257/329

(58) Field of Classification Search
CPC ............... H01L 29/66712; H01L 29/7802; H01L 29/7809; H01L 29/66666; H01L 29/7827
See application file for complete search history.

(56) References Cited

U.S. PATENT DOCUMENTS

| | | | |
|---|---|---|---|
| 4,259,779 A | 4/1981 | Ipri et al. | |
| 4,591,890 A | 5/1986 | Lund et al. | |
| 4,789,882 A | 12/1988 | Lidow | |
| 4,837,606 A * | 6/1989 | Goodman et al. | 257/139 |
| 5,019,522 A | 5/1991 | Meyer et al. | |
| 5,262,336 A | 11/1993 | Pike, Jr. et al. | |
| 5,338,693 A | 8/1994 | Kinzer et al. | |
| 5,475,252 A | 12/1995 | Merrill et al. | |
| 5,831,318 A | 11/1998 | Spring et al. | |
| 6,165,821 A | 12/2000 | Boden, Jr. et al. | |
| 6,380,004 B2 | 4/2002 | Boden, Jr. et al. | |
| 6,476,456 B1 | 11/2002 | Boden, Jr. | |
| 6,707,103 B1 | 3/2004 | Boden et al. | |
| 6,747,312 B2 | 6/2004 | Boden, Jr. et al. | |
| 6,798,016 B2 | 9/2004 | Boden, Jr. | |
| 6,894,345 B2 | 5/2005 | Boden, Jr. et al. | |

(Continued)

OTHER PUBLICATIONS

Liu, Sandra, et al. "Single-Event Burnout and Avalanche Characteristics of Power DMOSFETs", IEEE 2007, NSREC, vol. 53, No. 6, Dec. 2006, pp. 3379-3385.

(Continued)

*Primary Examiner* — Benjamin Sandvik
(74) *Attorney, Agent, or Firm* — Marger Johnson & McCollom, PC

(57) ABSTRACT

A Vertical Power MOSFET (VDMOS) device with special features that enable the Power MOSFET or IGBT device to withstand harsh radiation environments and the process of making such a device is described. All implanted and diffused layers are "self aligned" to a "Sacrificial Poly" layer, which later on is removed, preparing the wafers for a "late gate" oxide to be grown. A starting material with graded doping profile in the epitaxial layer on the substrate is shown to increase the SEB capability of the Power MOSFET.

14 Claims, 14 Drawing Sheets

(56) References Cited

U.S. PATENT DOCUMENTS

| | | | |
|---|---|---|---|
| 7,091,080 B2* | 8/2006 | Spring et al. | 438/212 |
| 7,378,317 B2* | 5/2008 | de Fresart et al. | 438/268 |
| 8,643,067 B2* | 2/2014 | Alberhasky et al. | 257/263 |
| 8,674,439 B2* | 3/2014 | Sdrulla et al. | 257/341 |
| 2004/0021203 A1* | 2/2004 | Flohrs et al. | 257/578 |
| 2008/0048257 A1* | 2/2008 | de Fresart et al. | 257/341 |

OTHER PUBLICATIONS

Chen, Xing-Bi, et al., "Optimum Doping Profile of Power MOSFET Epitaxial Layer," IEEE Transactions on Electron Devices, vol. ED-29, No. 6, Jun. 1982, pp. 985-987.

Liu, Sandra, et al. "Effect of Buffer Layer on Single Event Burnout of Power DMOSFETs", IEEE 2007, NSREC Paper No. PJ-5, vol. 54, No. 6, Dec. 2007, pp. 2554-2560.

Beatty, Brent A, et al., "Second Breakdown in Power Transistor due to Avalanche Injection," IEEE Transactions on Electron Devices, vol. ED-23, No. 8, Aug. 1976, pp. 851-857.

Dawes, William R., et al., "Hardening Semiconductor Components Against Radiation and Temperature," Noyes Data Corporation, Park Ridge, New Jersey, 1989, p. 104.

\* cited by examiner

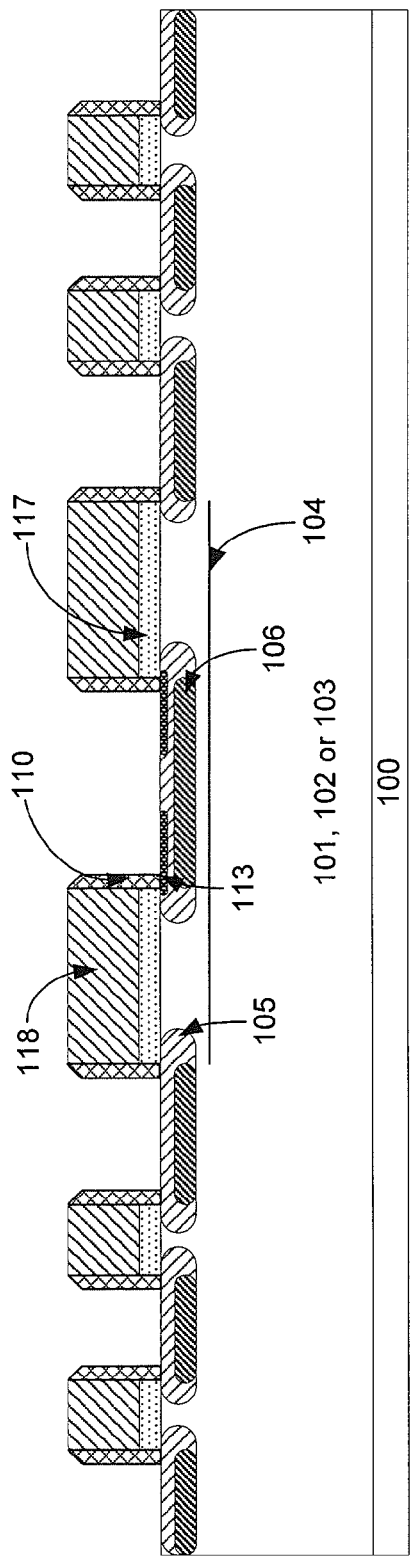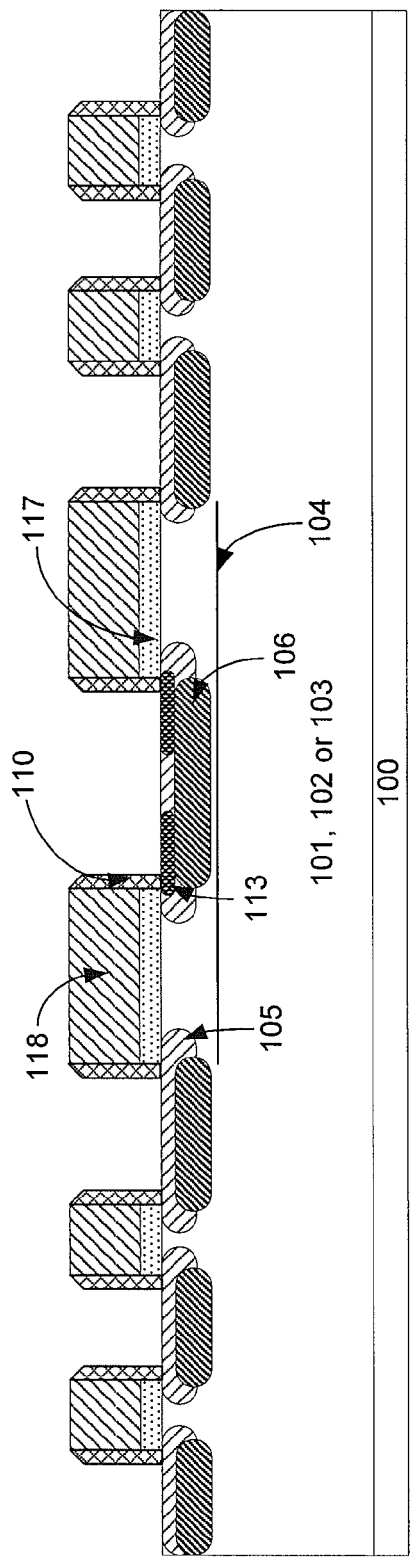

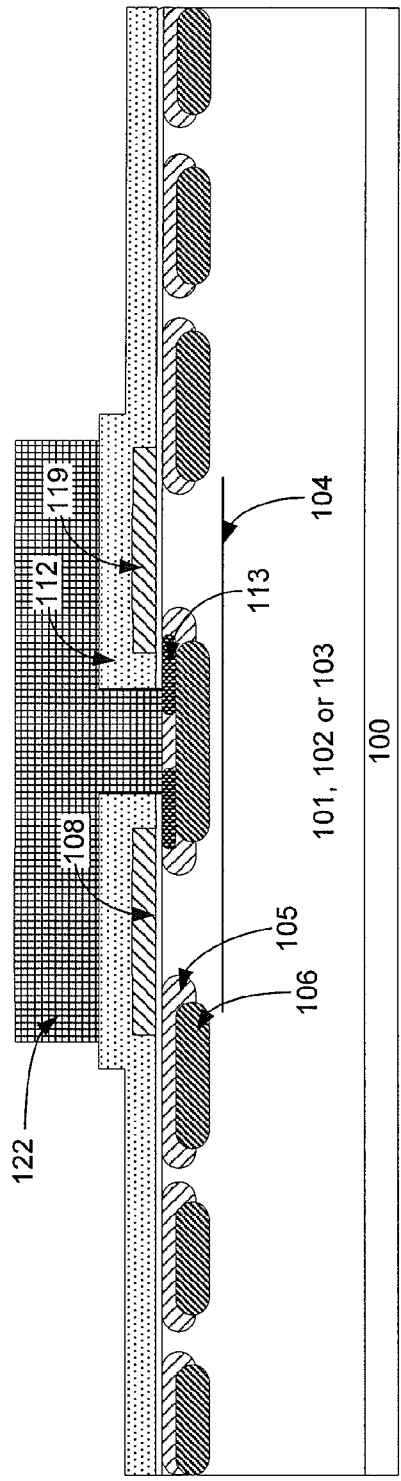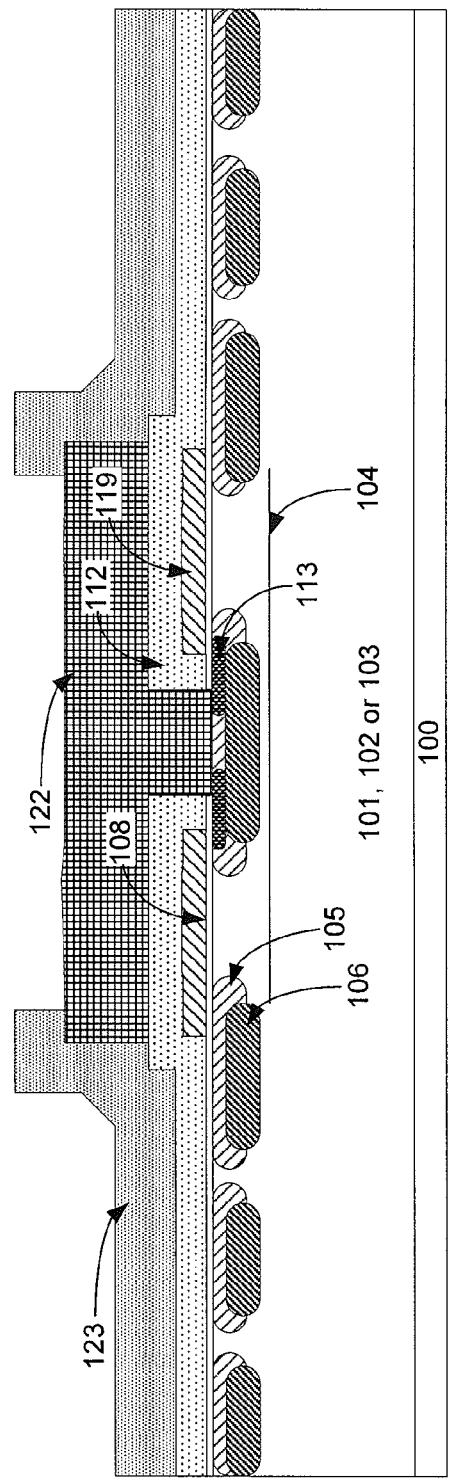

PSEUDO SELF ALIGNED RADHARD MOSFET AND PROCESS OF MANUFACTURE

RELATED APPLICATION DATA

This application claims the benefit of U.S. provisional patent application Ser. No. 61/586,888, filed Jan. 16, 2012, incorporated by reference herein.

FIELD OF THE INVENTION

This invention relates to Vertical Power MOSFETs (VDMOS hereinafter) suitable for space or military applications, where the radiation environment (light or heavy ions) creates conditions for severe degradation of electrical parameters of the MOSFET or even total destruction of the device. The invention addresses the main phenomenon known to date to deteriorate or destroy a Power MOSFET operating in space, namely the Single Event Burnout due to heavy ion bombardment.

BACKGROUND OF THE INVENTION

VDMOS transistors of various voltage and current ratings are these days the device of choice for high-frequency switching power supplies as they are incorporated in a wide variety of power control and conversion applications for space and military systems. Outer space applications such as communication satellites, weather satellites, GPS (Global Positioning Systems) and earth observations use many Power MOSFETs due to their high switching speed, low conduction losses and small foot print. One extra requirement for MOS (Metal Oxide Semiconductor) devices operating in outer space is long term reliability, with high tolerance to ionizing radiation, high energy particles and the like. For VDMOS Power Transistors, threshold voltage (Vth), blocking voltage (BVdss), leakage current (Idss), transconductance (Gm) and On Resistance (Rdson) are all affected by the ionizing radiation and therefore a Power MOSFET suitable for such an application has to be "radiation hardened" by design and fabrication process.

From the very beginning of using VDMOS devices in space applications, Single Event Burnout (SEB) was immediately identified as one of the main limitations of using commercial VDMOS devices in environments with increased flux of heavy ions. Much research has been devoted to SEB and to means to improve the capability of a VDMOS device under the bombardment of heavy ions. In summary, a high energy ion creates a "sheath" of electric charge along its path inside the semiconductor, proportional with its LET (Linear Energy Transfer).

If the drain bias of the VDMOS device exceeds certain values (or the electric field in the device approaches critical values) then, locally and within diameters smaller than one micron, the hole-electron density is increased, inducing current densities in excess of 104 A/cm2. Holes will be driven toward the surface for an N-Channel MOSFET and underneath the source layer of the VDMOS device and can easily develop a voltage drop close to or higher than 0.7V, turning on the parasitic bipolar transistor inherent to any VDMOS structure.

The doping of the P-Well underneath the source, the length of the source and the length of the channel are the main design and process parameters one has to optimize and control in order to increase the survivability of VDMOS transistor to heavy ions. Therefore, the placement of the heavy doping underneath the source or the alignment of the source inside of the P-Wells are of the utmost importance as slight lateral variations in the placement of these heavily doped layers can create uneven turn-on (sooner than desired) of the parasitic NPN transistor and lead to destruction of the Power MOSFET.

When the parasitic bipolar transistor gets turned on, it enters in what is called secondary breakdown of the NPN (for a N-Channel VDMOS), or the "snap back" mode of operation. Once the secondary breakdown phenomenon has been triggered, the entire energy of the power supply gets "dumped" at the location on the die where this mode of operation has been initiated. Following that, the local temperature of the die increases tremendously and the junctions of the device become shorted due to diffusion of the top metals into semiconductor.

The most common way to reduce the propensity of the parasitic NPN to turn on is to increase the doping of the P-Well underneath the source. Increasing the doping of what is called the UIS (Unclamped Inductive Switching) implant layer has its own limitations as the doping of this layer can easily reach the silicon-silicon dioxide interface (channel region) and, when it does that, the threshold voltage of the part, at that location, has a sharp increase, virtually making a "dead" MOSFET at that location. The diffusion of the UIS layer into the channel is exacerbated if the location of the implant is improperly placed, in other words, if one side of the implant is closer to the channel region. Therefore, as important as the doping level, perfect placement (or perfect "alignment") of the UIS layer in relationship to the source or the P-Well is the goal of any manufacturer of radhard MOSFETs.

As is known in the art, the gate of a lateral semiconductor device can be "self-aligned" to its corresponding source and drain regions. In such cases, the gate is used to mask a dopant implantation step that is performed to create the source and drain regions. Dopant is implanted in regions not blocked by the gate, and dopant is not implanted in regions blocked by the gate. As a result, an edge of the source region and an edge of the drain region are tightly aligned with edges of the gate, and subsequent drive or diffusion steps will ensure that the gate overlaps the edge of the source and drain regions. Therefore, in lateral devices, by ensuring the critical characteristic of the gate's overlap of the source and drain regions, this gate "self-alignment" technique may result in improved device performance.

In vertical DMOS semiconductor device fabrication, self-alignment of the source and body diffusions is itself important to providing symmetrical channel lengths and uniform channel structures. Both lateral MOS and vertical DMOS self-aligned processes rely on early formation of the gate structure, to which the body and source diffusions are self-aligned. As described in U.S. Pat. No. 4,259,779, however, forming a gate oxide after relatively high-temperature fabrication steps (such as those used to create doped regions in a substrate) may prevent substantial degradation of the radiation resistance of vertical DMOS semiconductor devices. This procedure, referred to as late-gate formation, is inconsistent with the foregoing self-alignment procedures.

Recent research, simulation and experimental work have demonstrated that increasing the secondary breakdown of the parasitic NPN transistor can be achieved if the electric field at the transition region between the epitaxial ("epi") layer and the substrate is "tailored" by using two epi layers (Liu, Sandra, "Effect of Buffer Layer on Single Event Burnout of Power DMOSFETs", IEEE 2007, NSREC Paper No PJ-5 and Liu, Sandra, "Single-Event Burnout and Avalanche Characteristics of Power DMOSFETs," IEEE 2006, NSREC Paper No. 6, Vol. 53, December 2006). By increasing the doping of the first epi layer (the one closer to the substrate), the carrier multiplication in the presence of high electric field and in the presence of charge generated by the heavy ion is minimized ("avalanche injection" effect is minimized, see Beatty, Brent A, "Second Breakdown in Power Transistor due to Avalanche Injection, IEEE Transactions on Electron Devices, Vol. ED-23, No. 8, August 1976). By creating a lower electric field "charge multiplication effect" is also lower and therefore less carriers are driven toward the ground terminal, with lower chances that the NPN parasitic bipolar will be turned on.

As shown by the work of Sandra Liu, the addition of a buffer epitaxial layer is an improvement but the "snap back" phenomenon is still present, nevertheless at higher voltages, but it is still there. This approach has the drawback that any additional epitaxial layers, regardless of their doping, are detrimental to the Rdson of the VDMOS and therefore a tradeoff between the secondary breakdown and the On Characteristics of the device has to be accepted.

Accordingly, a need remains for a better way to make radiation resistant ("radhard") power MOSFET devices.

SUMMARY OF THE INVENTION

One aspect of the invention is a manufacturing method of making a VDMOS power transistor in which all essential implanted and diffused layers are self aligned to a sacrificial masking layer such as polysilicon ("poly"), which later in the process is stripped off and a late gate oxide is grown.

In a radiation hardened high voltage semiconductor device, body regions and source regions in a substrate are tightly aligned with each other due to being implanted through the same openings in a sacrificial layer. A spacer layer is formed in the openings of the sacrificial layer and is largely removed, but spacer walls are left adjoining the walls of the sacrificial layer at the edges of the openings. UIS regions in the substrate are tightly aligned to the source regions due to being implanted through the remaining openings between the spacer walls. Finally, a gate oxide is formed late in the process, after the high temperature dopant implantation and diffusion steps, preventing the degradation of a radiation resistance of the gate oxide. Tight alignment of all three regions results in transistors that are substantially symmetric, which may increase a performance characteristic of the resulting high-voltage radiation-hardened semiconductor device.

In another aspect of the invention, the VDMOS device is made on an epitaxial ("epi") layer with a graded doping profile. One advantage is that a "graded epi" has a significantly higher secondary breakdown of the parasitic NPN transistor in comparison to step epi and, if properly designed, will produce a MOSFET with a lower Rdson.

While we refer to a MOSFET, this invention also extends to IGBT devices and the like which include a MOSFET structure.

The foregoing and other objects, features and advantages of the invention will become more readily apparent from the following detailed description of a preferred embodiment of the invention that proceeds with reference to the accompanying drawings.

BRIEF DESCRIPTION OF THE DRAWINGS

FIGS. 3-18 are cross-sectional views of the VDMOS transistor, illustrating an embodiment of a process flow to manufacture the device, according to the principles of this invention, in the following steps:

FIG. 3 shows sacrificial oxide and sacrificial poly layers as deposited.

FIG. 4 shows patterning of sacrificial poly layer for the "self aligned" implantations.

FIG. 5 shows a P-well ion implantation using the patterned sacrificial poly (active area and termination) as a mask.

FIG. 6 shows a P-well diffusion (active area and termination).

FIG. 7 shows a sacrificial oxide patterning for source implantation.

FIG. 8 shows thin spacer deposition and etch.

FIG. 9 shows a UIS 1 implant.

FIG. 10 shows a "co-diffusion" of the source and UIS implants.

FIG. 11 shows a photo thin process (photo resist recessed and exposing the top of the poly).

FIG. 12 shows a sacrificial poly etch (dry etch, isotropic, low oxide/silicon selectivity).

FIG. 13 shows an oxide etch (the entire surface of wafers is cleared of oxide).

FIG. 14 shows a blow up cross section of the center part of FIG. 13, with emphasis on perfect symmetry (left and right) of the structure around the geometrical center.

FIG. 15 shows a "late gate oxide" process.

FIG. 16 shows a final poly deposition and etch and BPSG deposition, reflow and patterning.

FIG. 17 shows a front metal deposition and patterning.

FIG. 18 shows a passivation (oxynitride) deposition and patterning.

DETAILED DESCRIPTION

For simplicity only the process flow pertaining to a N-Channel VDMOS will be described, for people familiar with the subject it will be readily apparent that the polarity of all doped layers of the device should be changed if a P-Channel Power VDMOS is to be made. The described inventions can also be used to make rad-hard IGBT devices of either polarity.

For the person familiar with the subject, it will become apparent that the cross sections represent a small section of the active area and a portion of the termination, surrounding the active area. For a real VDMOS transistor, the active area is formed by "repeating" a "basic" cell, which can be either "stripes" of gate fingers or "closed" cells of various shapes (squares, rectangles, hexagons, crosses, and so on). This invention, in concept and substance, is applicable to any top layout design of a Vertical Power MOSFET.

The process flow of a VDMOS according to this invention starts with epitaxial wafers of any type of doping (either N-type or P-Type) 101,102,103 grown on a substrate 100 of the same polarity as the epitaxial layer.

Figure 1:
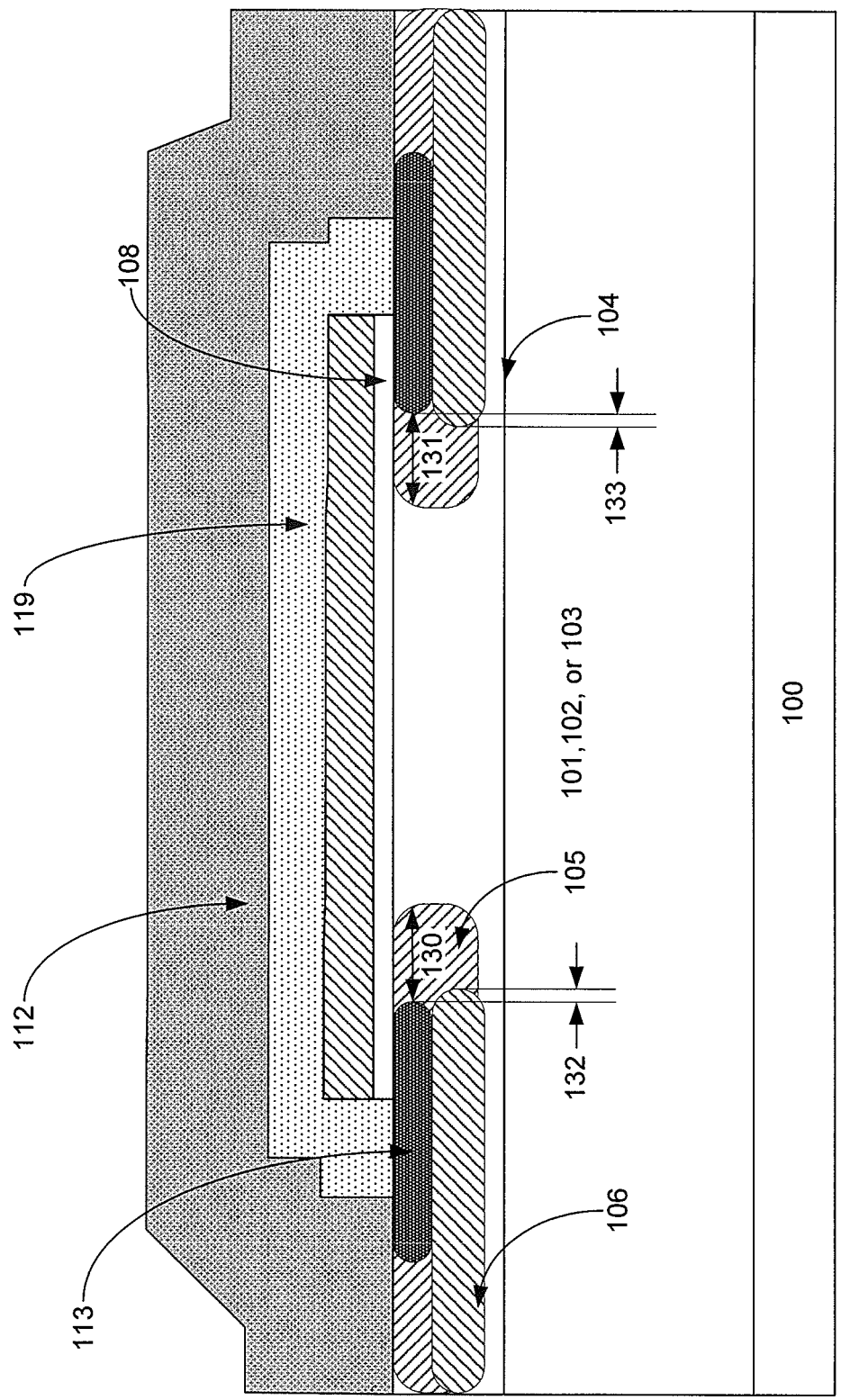
FIG. 1 is a cross section of a gate finger of an embodiment of a VDMOS device with perfectly aligned diffusion layers, as result of the pseudo self-aligned process flow of the invention.
Figure 2:
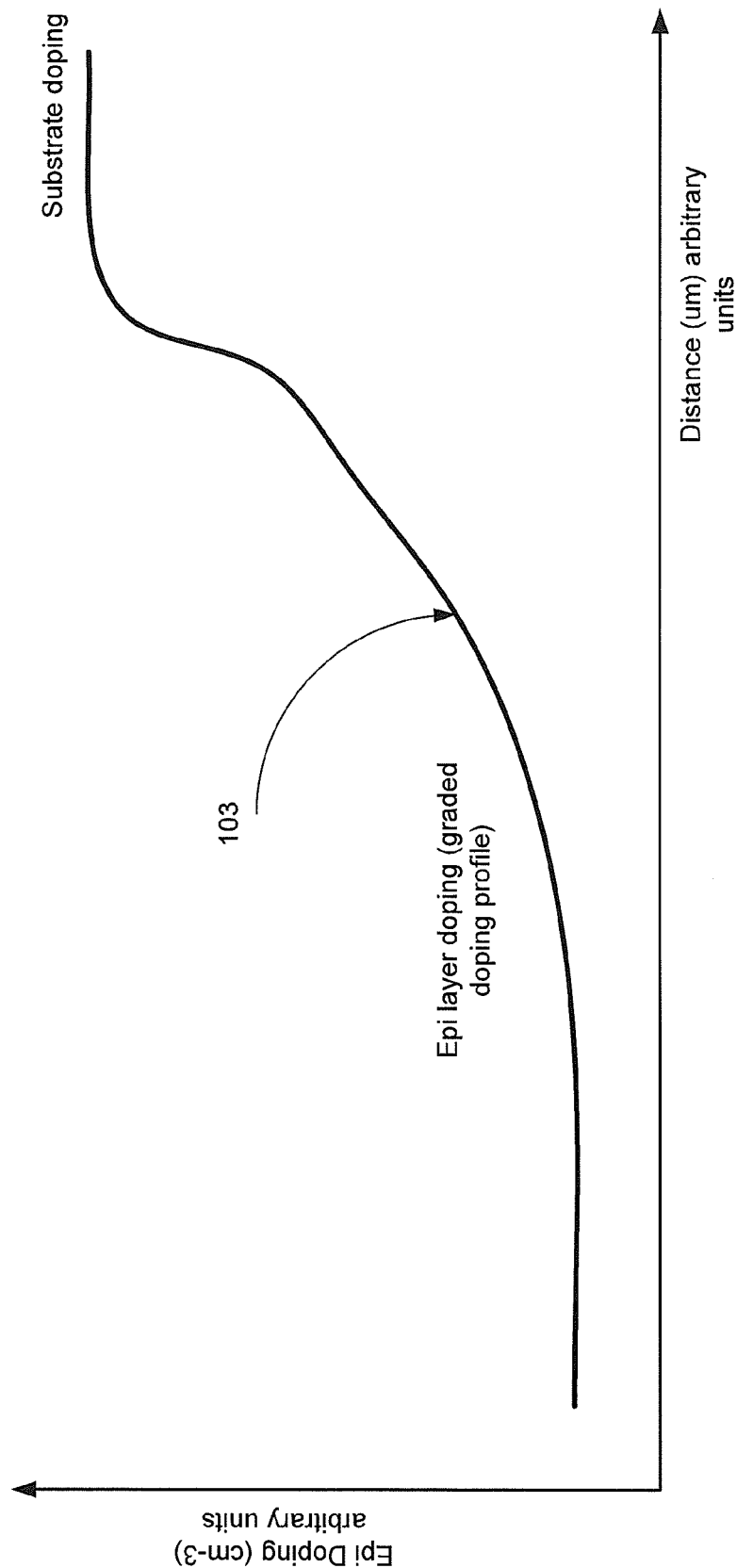
FIG. 2 shows in a generic way a "graded epi" doping profile according to this invention.

FIG. 2 shows a preferred gradient doping profile in which the substrate doping at the right has a first doping in the wafer and the upper epitaxial layer has a less second doping that is least near the upper surface on the left and increases in a gradient proceeding depthwise (rightward in FIG. 2) toward the wafer layer and substrate doping. This graded doping profile is substantially continuous.

Figure 3:
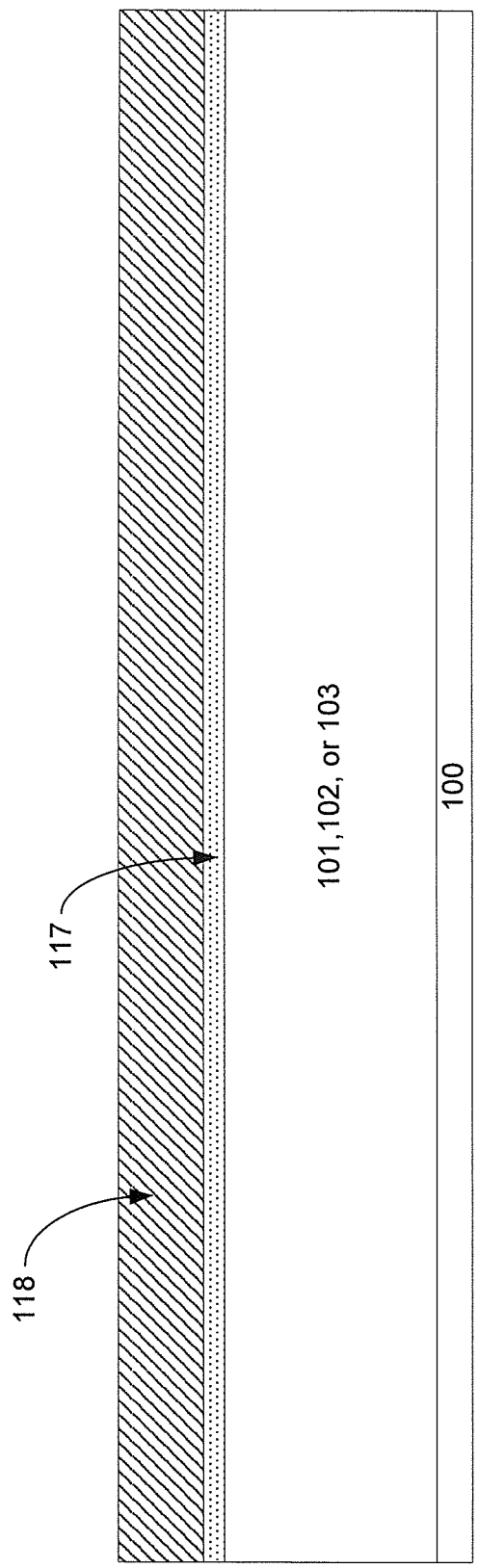

After standard cleaning, a sacrificial oxide layer 117 and a sacrificial polysilicon ("poly") layer 118 are deposited. (FIG. 3). The sacrificial oxide layer can be around 1000 A (750 A-1500 A) thick and the sacrificial poly layer can be around 12000 A (10,000 A-15000 A) thick. The sacrificial poly layer can be referred to more generally as a sacrificial masking layer, and can be formed of other materials with slow etch rate in hydrofluoric solutions, such as Oxynitride or Nitride. Optionally, prior to this step, a light doping enhancement implantation (usually called "Jfet" implant, 104) can be performed either through a mask or across the entire surface of the wafers.

Figure 4:
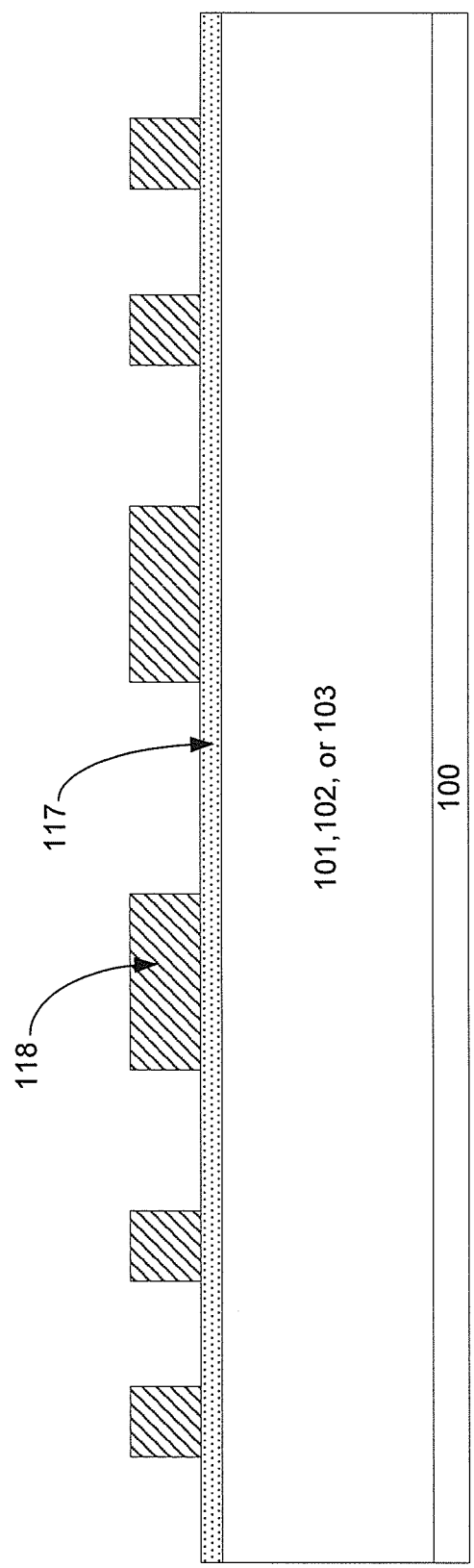

Following a standard photo masking step the sacrificial poly 118 is patterned according to the designed layout of the structure (FIG. 4), for example as stripes. The central area above the JFET region 104 is referred to as the active area.

Figure 5:
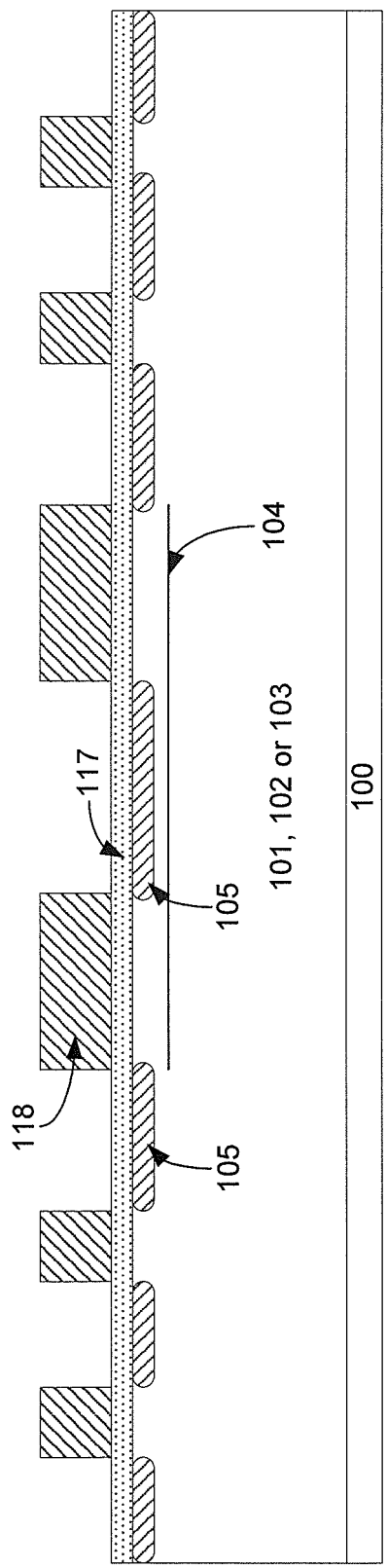
Figure 6:
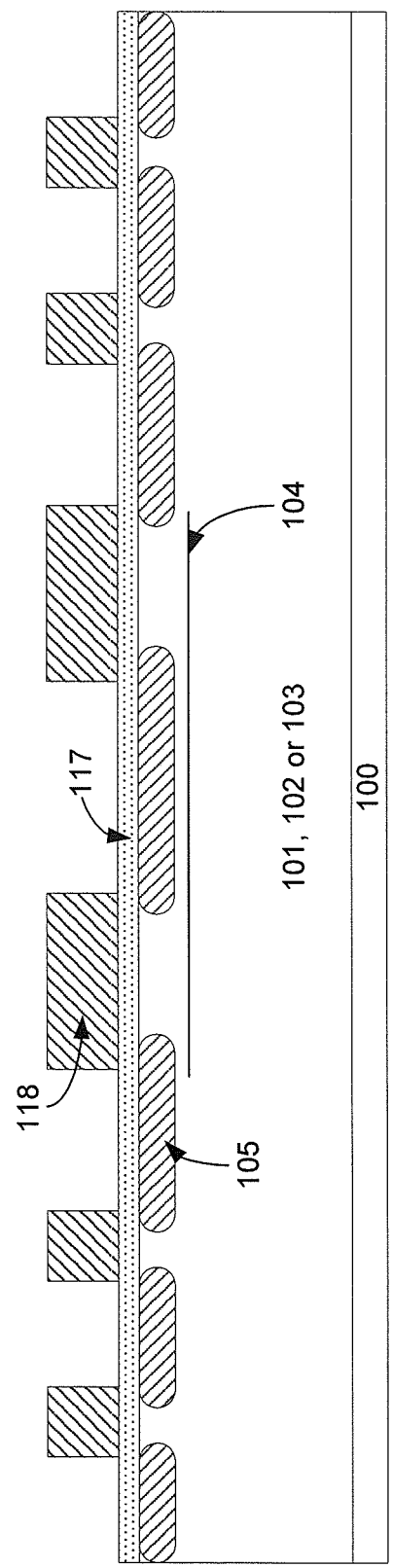

FIG. 5 is a cross-sectional view of the device after P-Well implants 105 are placed inside of the windows created in the sacrificial Poly. The remaining oxide 117 on the wafers is easily penetrated by the implantation ions if the proper implant energy is chosen.

Figure 7:
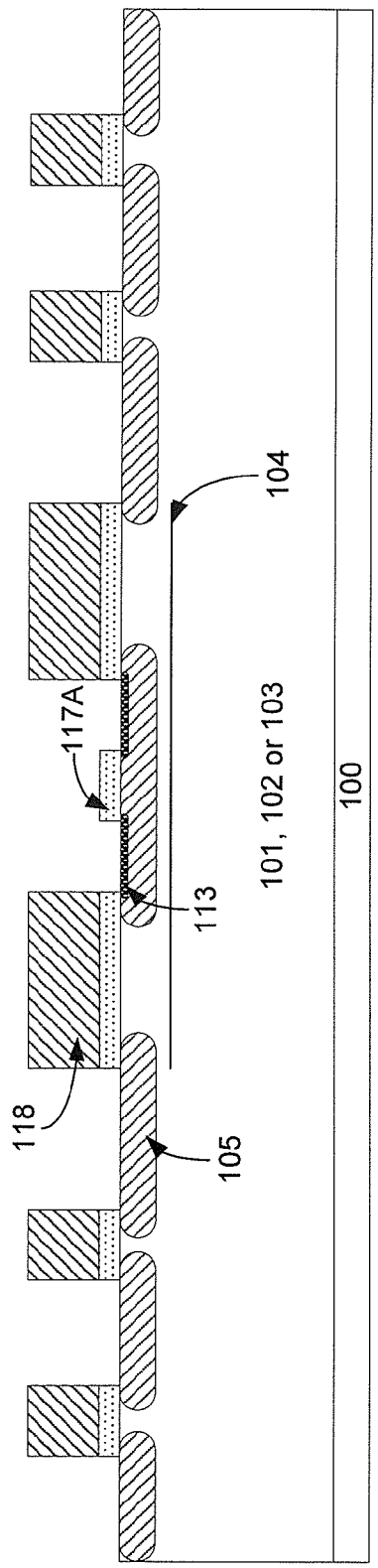

The implanted P-Wells 105 are driven to the desired depth and then, using a properly designed mask, at FIG. 7 the sacrificial oxide 117 is patterned such that a source ion implantation layer 113 is placed inside of the P-Wells. The remaining oxide 117A masks a central body contact region 119 of the substrate spaced between the polysilicon strips 118 to permit later metal contact by metal 122 (FIG. 17) to the P-well body 105 and the source implants 113 to enable forming a source-body short. As one can see, the laterally outward ends of the source implant is perfectly aligned to the P-Wells as the sacrificial poly 118 acts as an implant barrier for both the P-Well and Source implants and its edge defines the starting point of the implanted layer. (Note: the laterally inward ends of the source implant regions adjoining region 119 are non-critical, region 119 need not be exactly centered. See FIG. 14.) From that starting point, the vertical and lateral diffusion of the implanted species is governed by the physics of the diffusion and it is virtually identical on both sides of the sacrificial poly pseudo-gates 118. (Structures 118 are called "pseudo-gates" to distinguish from the real gates formed at FIG. 16.)

Figure 8:
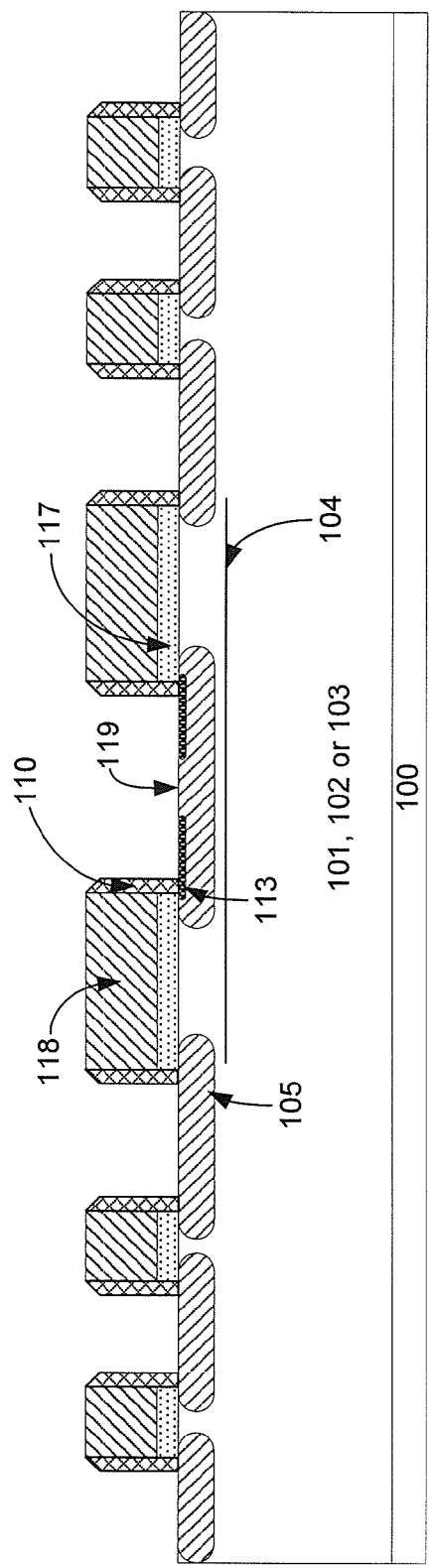

The same sacrificial poly 118 is used now for the creation of oxide spacers 110 (FIG. 8), placed along the edges of the sacrificial poly pseudo-gates 118 to offset the next heavy ion implantation 106 (FIG. 9), which has the same polarity as the P-Wells (and opposite polarity as the source implants).

The role of these high dose implants 106 is to minimize the base resistance of the parasitic NPN transistor and therefore their dose level and their placement is essential in improving the survivability of the Power MOSFET under heavy cosmic ion bombardment (FIG. 9). These heavy dose layers are usually called UIS implants as they significantly increase the capability of the power MOSFET to withstand high currents while in avalanche mode (Unclamped Inductive Switching test).

In an example of the UIS implant, boron is used for the N-channel device, phosphorus for a P-channel device. A suitable dose is in the range of 1E15 to 3E15/cm2, with a target of 2E15/cm2. Energy levels for depth placement can be around 160 Key (120-180 Key) for sacrificial poly thickness of around 13000 Angstroms (Range: 10,000-15,000 Angstroms).

The next step is co-diffusion of the source 113 and the UIS layers 106 (FIG. 10), after which the wafers are coated with a thin layer of photo-resist 116. Thickness and uniformity of the resist layer 116 are important as they determine the amount of resist to be removed in the next process step in FIG. 11. A suitable photoresist thickness can be 1.5 to 2 micrometers. The teachings of this process are described in applicant's U.S. Pat. No. 5,019,522.

Figure 11:
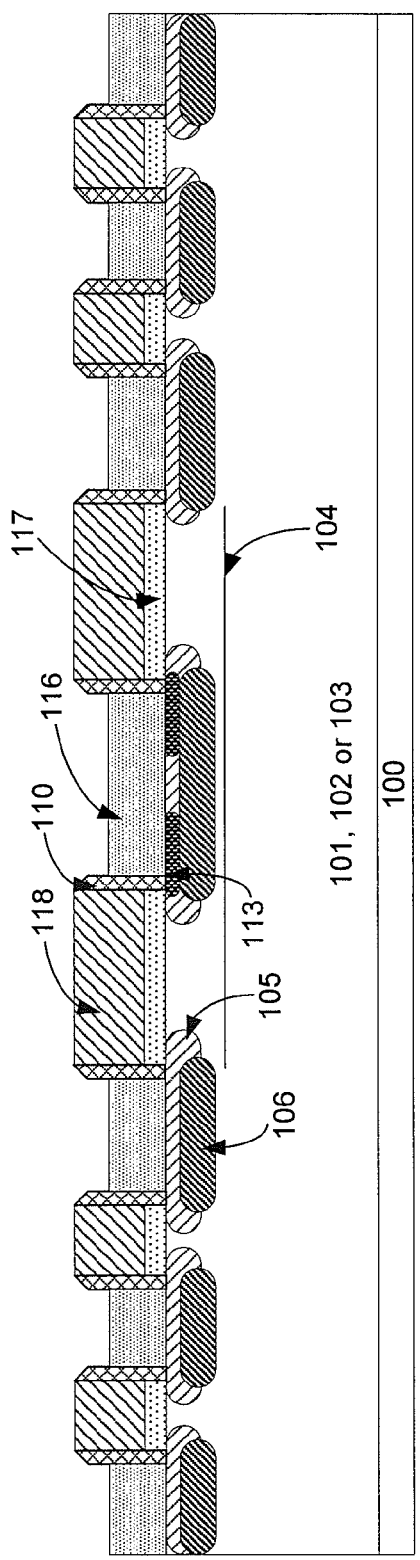

As mentioned, the resist is "thinned" during a plasma resist etching process such that only the top of the sacrificial poly layer 118 and the tops of the side wall oxide spacers are exposed (FIG. 11).

Figure 12:
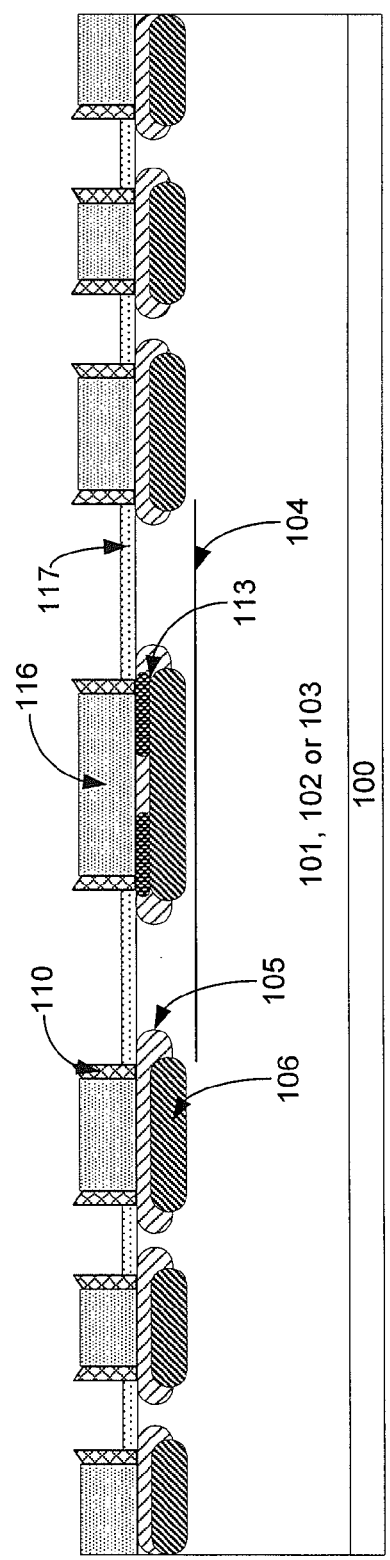

Once the sacrificial poly 118 is fully exposed this layer is removed using an isotropic plasma etch of silicon, shown in FIG. 12. Any silicon dry etch process with a reasonable isotropy and selectivity (silicon to oxide etch rates) is suitable for this step.

Figure 13:
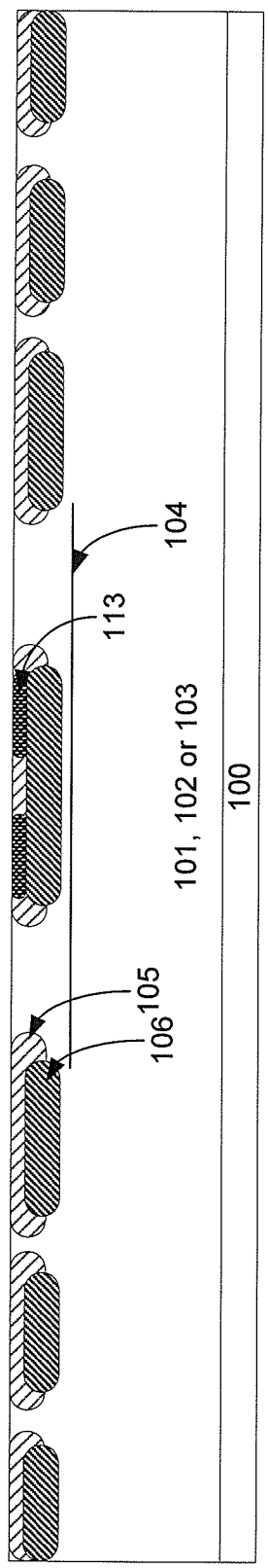

Following total removal of the sacrificial poly, the wafers are cleared of any residual oxide by immersing them in hydrofluoric etching solution (FIG. 13). Wafers prepared in this way have all desired layers embedded in silicon at the desired depth in vertical direction and with virtually perfect alignment in the lateral/horizontal direction of various implanted layers. In other words, the laterally outer edges of the P-well (body), the source implants and the UIS region are substantially symmetrical about centerline C/L (FIG. 14), as are the channel regions adjoining the outer edges of the source implants.

Figure 14:
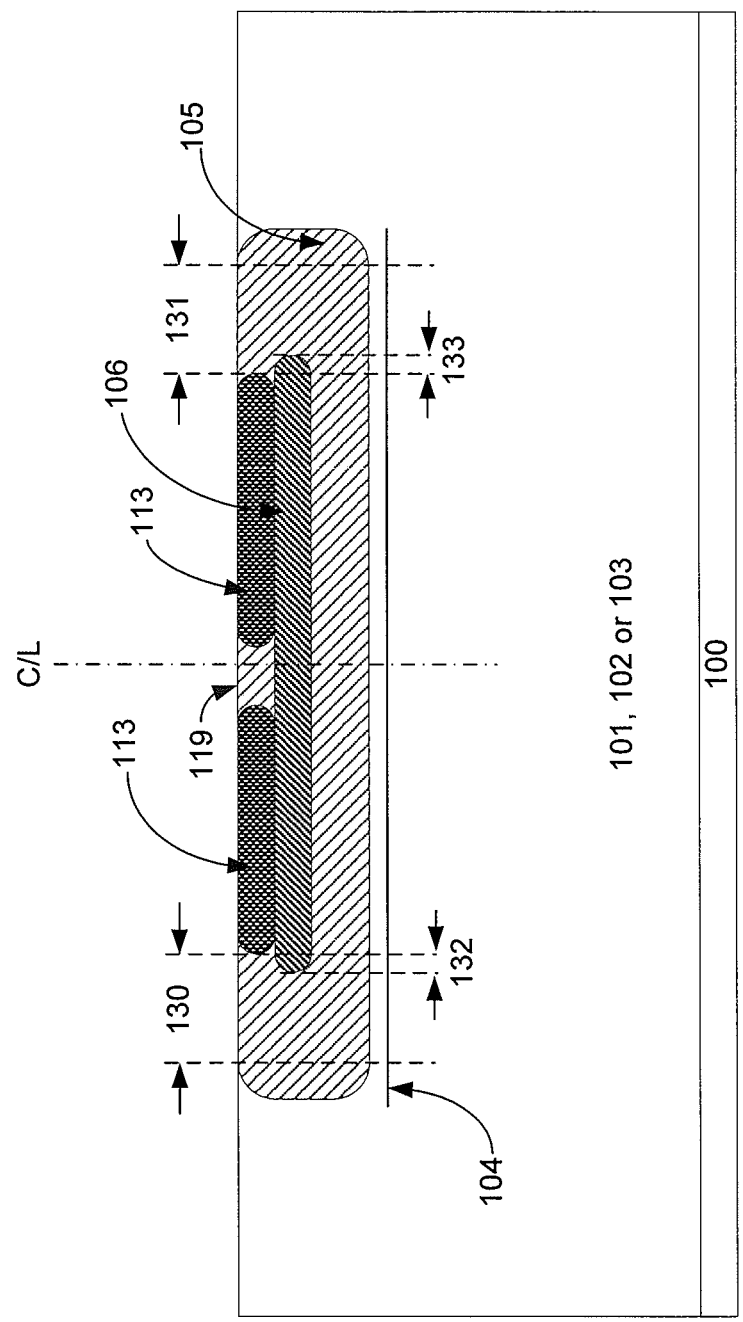

FIG. 14 is a close up cross section of a P-Well region with all the required layers to create a VDMOS transistor, perfectly aligned inside of the P-Well. By achieving identical channel length (130, 131), threshold voltage across the entire die is uniform and therefore a uniform temperature across the entire active area is maintained for any drain current. Having the UIS implants 106 aligned laterally underneath the source implants 113 creates the same turn-on conditions for the parasitic NPN over the entire die area, with obvious beneficial results for SEB tests.

Figure 15:
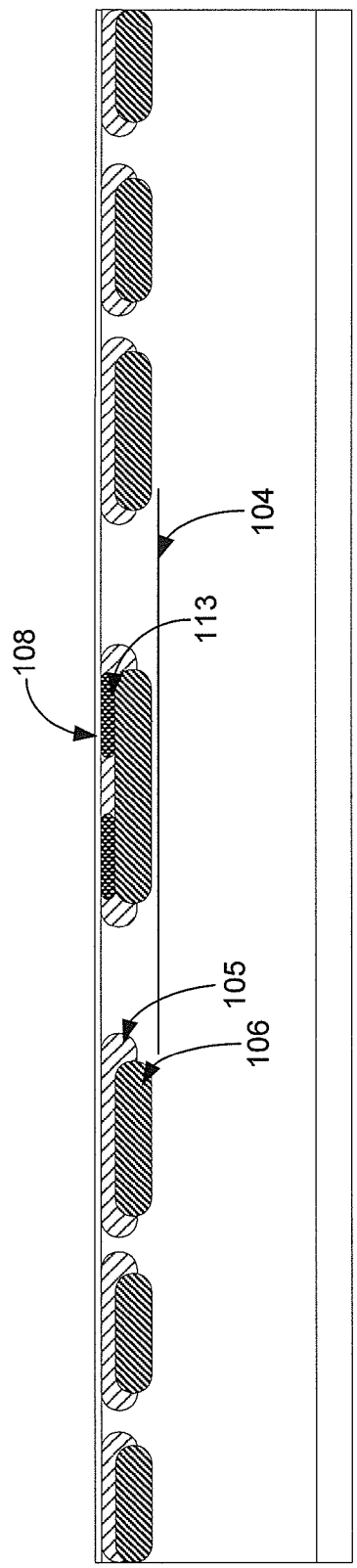

A late gate oxidation process is now performed (108, FIG. 15), with all the specifics of a thermal oxidation process specially tailored for radiation hardened MOSFETs, specifics that will not be disclosed here as they are well-known and not relevant to the teaching of this invention. The resulting gate oxide is substantially free from interface and oxide traps.

Figure 16:
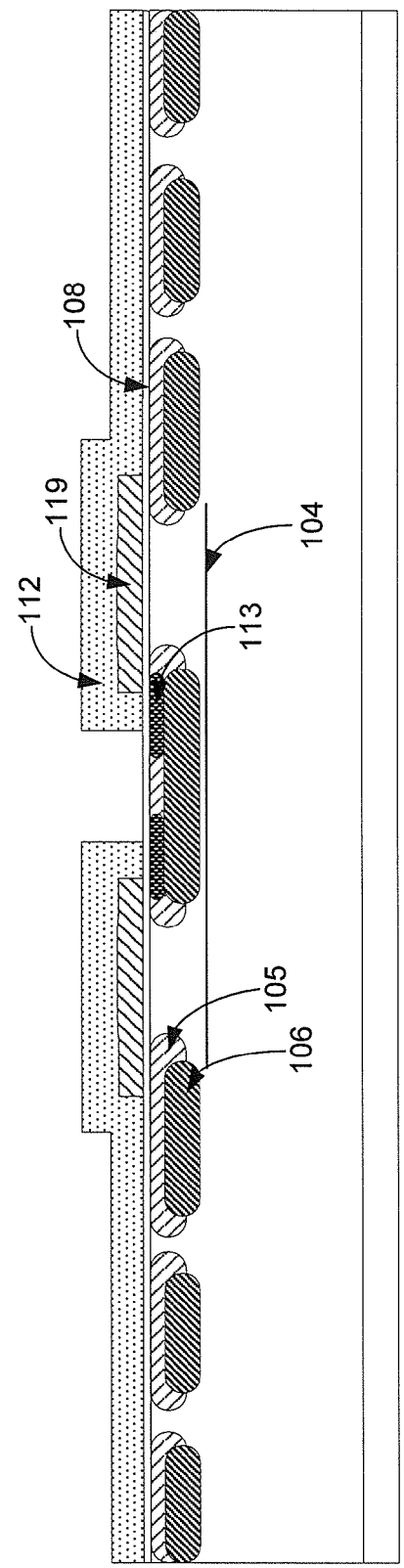

The final poly layer 119 is then deposited on the late gate oxide layer 108, doped and patterned on the wafers. (FIG. 16).

An inter-dielectric layer 112 of choice (most commonly used being a boro-phospho-silicate glass BPSG layer) is deposited and re-flowed at relatively low temperatures, such that the anti-radiation properties of the gate oxide layer are not degraded by the reflow thermal process step. This inter-dielectric layer 112 is then patterned to expose the source and the P-Wells. A top metal layer 122 is now deposited, patterned and etched (FIG. 17).

Patterning of the final poly layer 119 and the inter-dielectric layer are noncritical. The critical lateral alignments have already been established in prior steps, as shown in FIG. 14.

The next steps are standard for any VDMOS transistors, namely passivation 123 deposition and etch (FIG. 18), backside grinding, optional backside implantation and implant activation and backside metallization of wafers.

The process steps outlined so far can produce a Radhard MOSFET with increased ruggedness for SEB tests, regardless of the type of starting material. In the following paragraphs we document that the use of graded epi, another aspect of this invention, further increases the capability of a VDMOS to survive an SEB test.

Simulation work on graded epi has been done before but only as an effort to reduce the On Resistance of the Power MOSFET.

Xing-Bi Cheng and Chenming Hu, using analytical equations, published in IEEE Transactions on Electron Devices, June, 1982, indicate that a graded epi profile (variable doping between the top part of the wafers toward the heavily doped substrate) can lower Rdson of a Vertical Power MOSFET at least by about 6%, for the same primary breakdown voltage BVdss.

Using this as a starting point and employing advanced simulation tools we have discovered that a VDMOS transistor can benefit for SEB test if the device, made using state of the art process (i.e. pseudo self aligned process flow) is manufactured on wafers with a graded doping profile.

Advanced TCAD simulation tools, like Silvaco, allows one to "create" a VDMOS structure identical with the unit cell of the real device. All main elements of the VDMOS cell are present in the simulated structure, and the electrical performance of such a device can be analyzed and compared changing only one variable.

In our study we optimized the top side of the Power MOSFET for the best electrical characteristics (Rdson, Vth) for a given voltage rating and then we changed only the epitaxial layers of the structure, and compared the blocking capability of such structures under very high drain currents.

The conclusion of such optimization work of the secondary breakdown voltage of such a VDMOS clearly pointed out that a graded epi design has a tremendous potential to increase the secondary breakdown of the device.

The table below is a snapshot of various simulation results and shows that a graded epi profile has a Vbr2 (where Vbr2 is the secondary breakdown of the parasitic NPN transistor) more than twice that of a step epi design, while the On Resistance of the MOSFET is still low.

| Epi design | Vth | BVdss (V) | Vbr2 (V) | Rdson (mohms) |
|---|---|---|---|---|
| Step Epi | 3.75 | 288 | 85 | 110.6 |
| Graded Epi | 3.75 | 240.9 | 280 | 77.8 |

Figure 19:
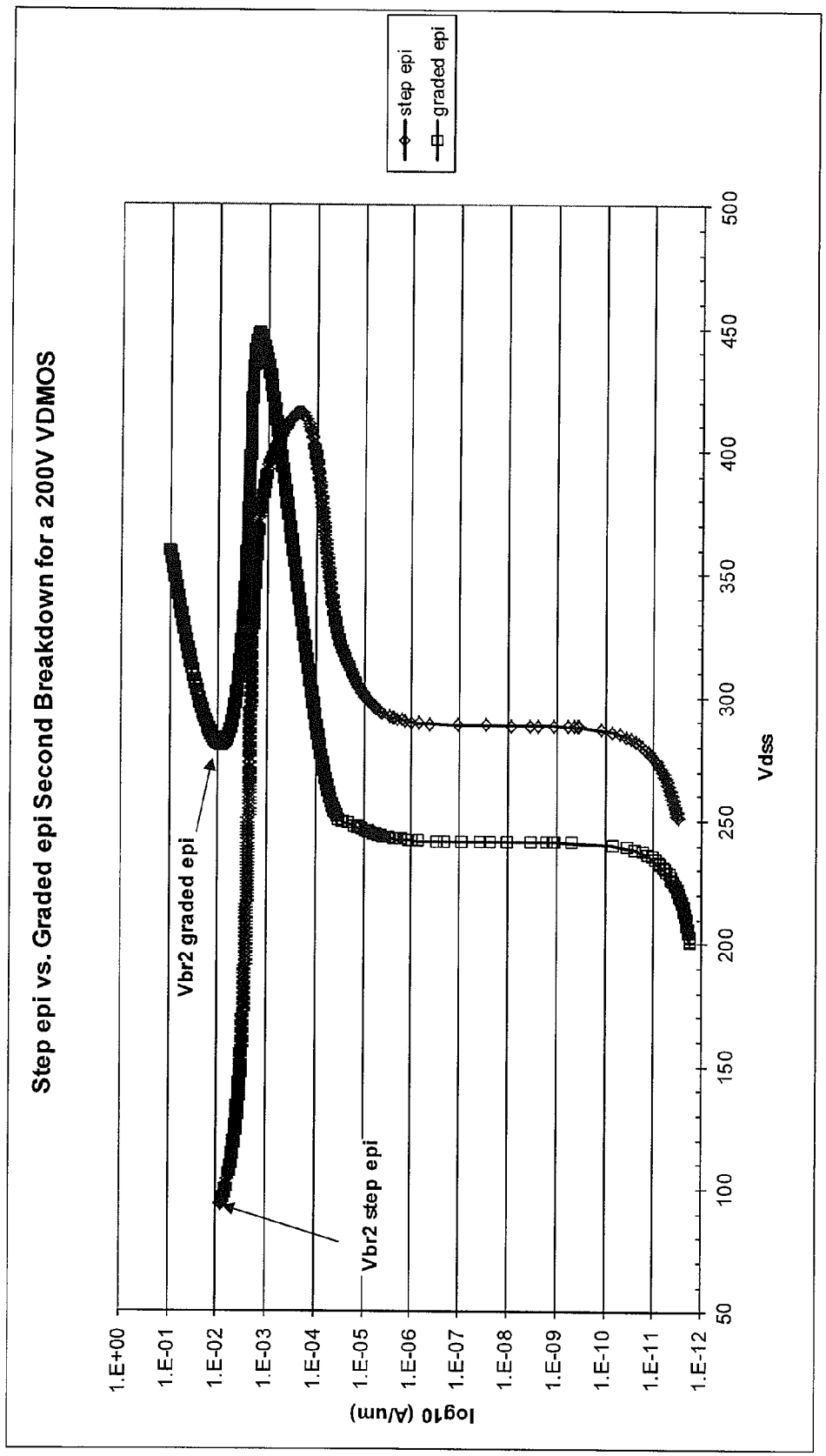
FIG. 19 is a graph which represents a comparison of the secondary breakdown voltage of a "step epi" and "graded epi" design of a 200V VDMOS.
Figure 20:
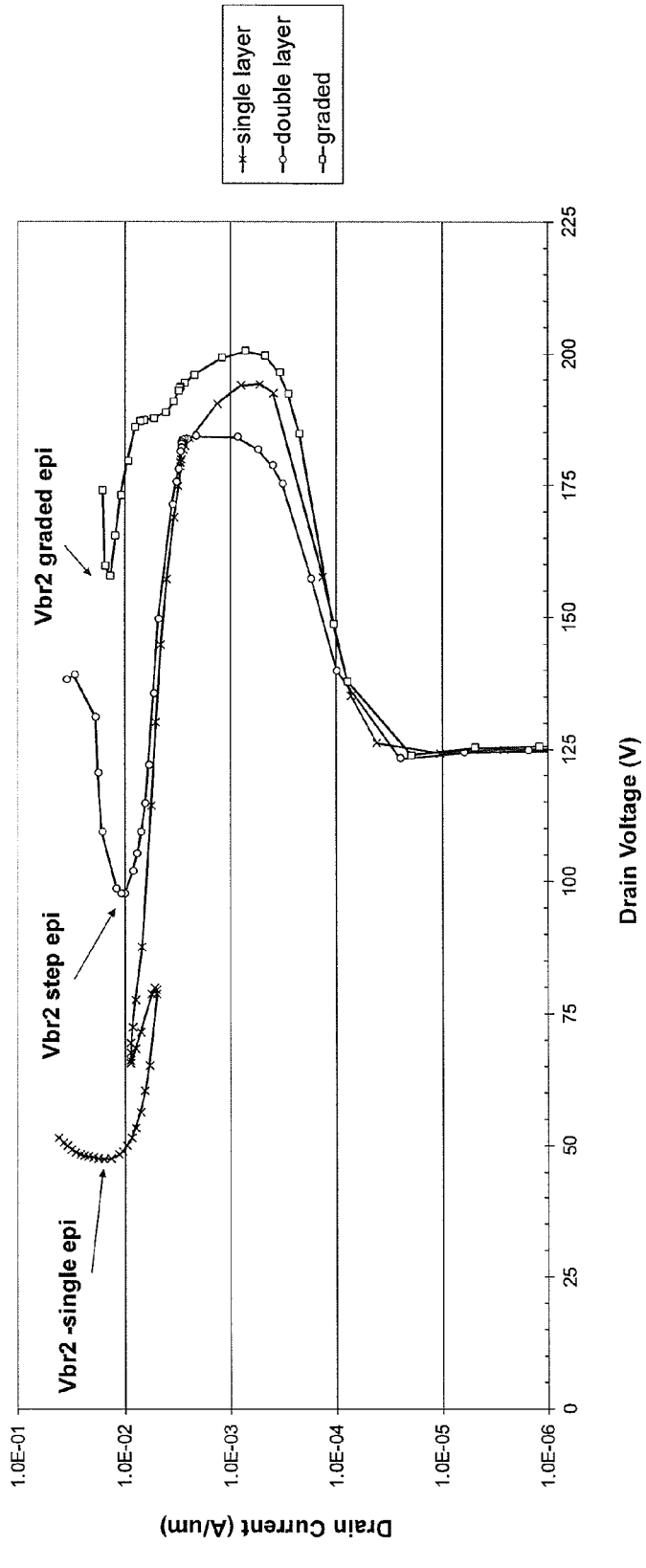
FIG. 20 is a plot which compares the secondary breakdown of a "single epi", "step epi" and "graded epi" design for a 100V VDMOS.

FIG. 19 shows a direct comparison of the Id-BV characteristics of a step epi and a graded epi design for a 200V rated MOSFET. Vbr2 denotes the secondary breakdown point, while FIG. 20 shows the same comparison, this time for a 100V rated MOSFET.

Based on TCAD work described above, VDMOS transistors with step epi and graded epi designs were manufactured and tested for SEB under the following conditions: Gold Ions, LET=89.9 MeV cm2/mg, Range=81.4 um, Energy=1500 MeV, Fluency=1.0E6 ions/cm2. The results, summarized in the table below clearly show that the graded epi design has improved SEB capability.

| Epi Design | Max Vds (V) | Max Vgs (V) | Comments |
|---|---|---|---|
| Step Epi | 90 | 0 | Fails requirements |
| Graded Epi | 100 | −5 | Meets requirements |

For the person skilled in this field of expertise the benefits of a graded epi design are apparent from the foregoing data.

Having described and illustrated the principles of the invention in various embodiments thereof, it should be apparent that the invention can be modified in arrangement and detail without departing from such principles. We claim all modifications and variations coming within the spirit and scope of the following claims.

The invention claimed is:

1. A method of fabricating a semiconductor device on a substrate of a first conductivity type, the method comprising:
   forming a sacrificial oxide layer on the substrate;
   forming a sacrificial masking layer on the sacrificial oxide layer;
   forming a body and source implant pattern in the sacrificial masking layer, exposing a portion of the surface of the sacrificial oxide layer;
   implanting and diffusing a dopant in the substrate through the body and source implant pattern to form a body region of the second conductivity type;
   removing the exposed sacrificial oxide within a portion of the body and source implant pattern, exposing a first portion of the top surface of the substrate bounded by sidewalls of the sacrificial masking layer;
   implanting a dopant in the substrate through the body and source implant pattern to form a source region of the first conductivity type;
   forming spacer walls on the sidewalls of the sacrificial masking layer to define a UIS implant pattern;
   implanting a dopant in the substrate through the UIS implant pattern to form a UIS region of the second conductivity type;
   diffusing the source region to form a channel region with a body region boundary and a source region boundary that are tightly aligned;
   removing the spacer walls, remnants of the sacrificial masking layer, and remnants of the sacrificial oxide layer to expose the top surface of the substrate;
   forming a late gate oxide layer on the exposed top surface of the substrate;
   forming a polysilicon layer on the late gate oxide layer; and
   removing a portion of the polysilicon layer above the source region in the substrate to expose a first surface of the late gate oxide layer overlaying the source region and to retain a portion of the polysilicon layer on the gate oxide layer overlapping the channel region.

2. The method of claim 1, further comprising:
   insulating the portion of the polysilicon overlapping the channel region;
   removing the exposed late gate oxide; and
   forming a source contact to the source region.

3. The method of claim 1 wherein the late gate oxide is thermally grown on the upper surface of the substrate over the body, source and UIS regions to be substantially free from interface and oxide traps.

4. The method of claim 1 in which the substrate includes a wafer layer of a first doping concentration and an epitaxial layer having a second doping concentration less than the first doping concentration, and wherein the second doping concentration increases in a gradient proceeding from the upper surface to the wafer layer.

5. The method of claim 1 in which the sacrificial masking layer includes polysilicon.

6. The method of claim 1 in which the sacrificial masking layer includes oxynitride or nitride.

7. A method of fabricating a semiconductor device on a substrate of a first conductivity type, the method comprising:
   forming a sacrificial layer above an upper surface of the substrate;
   forming a body and source implant pattern by removing a region of the sacrificial layer above a body and source implant portion of the top surface of the substrate;

implanting a body region of a second conductivity type in the substrate through the body and source implant pattern;

implanting a source region of the first conductivity type in the substrate through the body and source implant pattern, wherein the source region is tightly aligned to the body region;

forming a spacer layer above the body and source implant portion of the top surface of the substrate;

forming a UIS implant pattern by removing a region of the spacer layer above a UIS implant portion of the top surface of the substrate not covered by the sacrificial layer;

implanting a UIS region of the second conductivity type in the substrate through the UIS implant pattern, wherein the UIS region is tightly aligned to the source region;

forming at least one channel region between an edge of the body region and an edge of the source region, wherein the channel region is symmetrical around a vertical center axis through the source region;

exposing the upper surface of the substrate;

forming a late gate oxide on the upper surface over the channel region; and forming a region of polysilicon on the late gate oxide overlapping the channel region.

8. The method of claim 7 wherein the gate oxide is thermally grown on the upper surface of the substrate over the body, source and UIS regions to be substantially free from interface and oxide traps.

9. The method of claim 7 in which the substrate includes a wafer layer of a first doping concentration and an epitaxial layer having a second doping concentration less than the first doping concentration, and wherein the second doping concentration increases in a gradient proceeding from the upper surface to the wafer layer.

10. The method of claim 7, further comprising:
insulating the portion of the polysilicon overlapping the channel region;
removing the exposed late gate oxide; and
forming a source contact to the source region.

11. The method of claim 10 in which implanting a source region includes forming a pair of source regions spaced apart about a central body contact region to be contacted by the source contact.

12. The method of claim 7 in which the sacrificial layer includes a sacrificial oxide layer and a sacrificial masking layer on the sacrificial oxide layer which can be removed in selected regions to expose the sacrificial oxide layer.

13. The method of claim 12 in which the sacrificial masking layer includes polysilicon.

14. The method of claim 12 in which the sacrificial masking layer includes oxynitride or nitride.

* * * * *